United States Patent
Bode et al.

(10) Patent No.: US 12,322,472 B2
(45) Date of Patent: Jun. 3, 2025

(54) VOLTAGE GENERATION CIRCUIT FOR SRAM

(71) Applicant: NXP B.V., Eindhoven (NL)

(72) Inventors: Hubert Martin Bode, Haar (DE); Alexander Hoefler, Austin, TX (US); Glenn Charles Abeln, Buda, TX (US)

(73) Assignee: NXP B.V., Eindhoven (NL)

( * ) Notice: Subject to any disclaimer, the term of this patent is extended or adjusted under 35 U.S.C. 154(b) by 354 days.

(21) Appl. No.: 17/821,260

(22) Filed: Aug. 22, 2022

(65) Prior Publication Data

US 2024/0062791 A1 Feb. 22, 2024

(51) Int. Cl.
*G11C 7/10* (2006.01)
*G11C 5/14* (2006.01)
*G11C 7/14* (2006.01)
*H03K 19/094* (2006.01)

(52) U.S. Cl.
CPC .............. *G11C 7/1087* (2013.01); *G11C 5/14* (2013.01); *G11C 7/14* (2013.01); *H03K 19/09421* (2013.01)

(58) Field of Classification Search
CPC ............ G11C 5/14; G11C 7/14; G11C 7/1084
USPC ..................................................... 365/189.05
See application file for complete search history.

(56) References Cited

U.S. PATENT DOCUMENTS

| | | | |
|---|---|---|---|
| 7,283,410 B2 | 10/2007 | Hsu et al. | |
| 7,808,856 B2 | 10/2010 | Ehrenreich et al. | |
| 7,952,939 B2 | 5/2011 | Chen et al. | |
| 8,284,310 B2 | 10/2012 | Mallinson | |
| 8,767,428 B2 | 7/2014 | Asthana | |
| 8,917,561 B2 | 12/2014 | Asthana | |
| 9,947,391 B1* | 4/2018 | Mahatme | G11C 11/419 |
| 11,056,161 B2* | 7/2021 | Mahatme | G11C 11/419 |
| 11,196,574 B2* | 12/2021 | Lin | G11C 13/0061 |
| 2019/0058603 A1* | 2/2019 | Lin | H04L 9/0866 |
| 2020/0327927 A1 | 10/2020 | Kumar et al. | |
| 2021/0193236 A1* | 6/2021 | Cai | G06F 1/24 |
| 2022/0130454 A1 | 4/2022 | Dhori | |

FOREIGN PATENT DOCUMENTS

| | | |
|---|---|---|
| CN | 111739568 A | 10/2020 |
| EP | 3016107 B1 | 7/2019 |

* cited by examiner

*Primary Examiner* — Connie C Yoha
(74) *Attorney, Agent, or Firm* — David G. Dolezal

(57) ABSTRACT

A memory includes a supply voltage generation circuit for providing a supply voltage to a plurality of SRAM cells of the memory during at least one mode of memory operation. The supply voltage generation circuit includes a first reference generation circuit that includes at least one SRAM cell with a replica SRAM latch. The first reference generation circuit provides a first voltage during an at least one mode of memory operation. The supply voltage generation circuit includes a second reference generation circuit that includes at least one SRAM cell with a replica SRAM latch. The second reference generation circuit provides a second voltage during the at least one mode of memory operation. The voltage generation circuit includes an output for providing a supply voltage to the plurality of cells during the at least one mode of memory operation.

20 Claims, 3 Drawing Sheets

VOLTAGE GENERATION CIRCUIT FOR SRAM

BACKGROUND OF THE INVENTION

Field of the Invention

This invention relates in general to an SRAM and more specifically to a voltage generation circuit for an SRAM.

Description of the Related Art

A Static Random Access Memory (SRAM) is a memory that includes a plurality of SRAM cells for volatilely storing data during operation.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In one embodiment, a memory includes a supply voltage generation circuit for providing a supply voltage to a plurality of SRAM cells of the memory during at least one mode of memory operation. The supply voltage generation circuit includes a first reference generation circuit that includes at least one SRAM cell with a replica SRAM latch. The first reference generation circuit provides a first voltage during an at least one mode of memory operation. The supply voltage generation circuit includes a second reference generation circuit that includes at least one SRAM cell with a replica SRAM latch. The second reference generation circuit provides a second voltage during the at least one mode of memory operation. The reference generation circuit includes a comparison circuit that provides an indication of a comparison between the first voltage and the second voltage. The voltage generation circuit includes an output for providing a supply voltage to the plurality of cells during the at least one mode of memory operation. The voltage level of the supply voltage is based on the output of the comparison circuit. In one embodiment, the voltage level of the supply voltage is based on which of the first voltage or the second voltage is higher.

In some embodiments, providing a supply voltage generation circuit with a first reference generation circuit and a second reference generation circuit, each including at least one SRAM cell with a replica SRAM latch, may allow the supply voltage generation circuit to produce a supply voltage based on the threshold voltages of PFETs and NFETs of the SRAM cells of the array that is sufficient to retain data in the array and yet is reduced to allow for a minimization of power consumption during a low power mode of operation.

In order to reduce power during operation, some SRAMs implement a low power mode where the supply voltage to the SRAM cells is reduced from a higher power mode voltage level to a lower voltage level that is still sufficient to retain data in the cell. With some low power modes, it may be desirable to provide the lowest supply voltage level possible in order to reduce power consumption during the low voltage mode. However, variations in the threshold voltages of the FETs of the SRAM cells due to temperature, age, and process variation often require a higher tolerance margin in the low power mode supply voltage, and therefore a higher power consumption than may be necessary.

Accordingly, providing a voltage generation circuit whose output is based on a comparison of voltages from replica SRAM latches, may provide for a low power mode supply voltage that can be adapted for variations due to process, temperature, and age, and yet be minimized for reduced power consumption.

Figure 1:
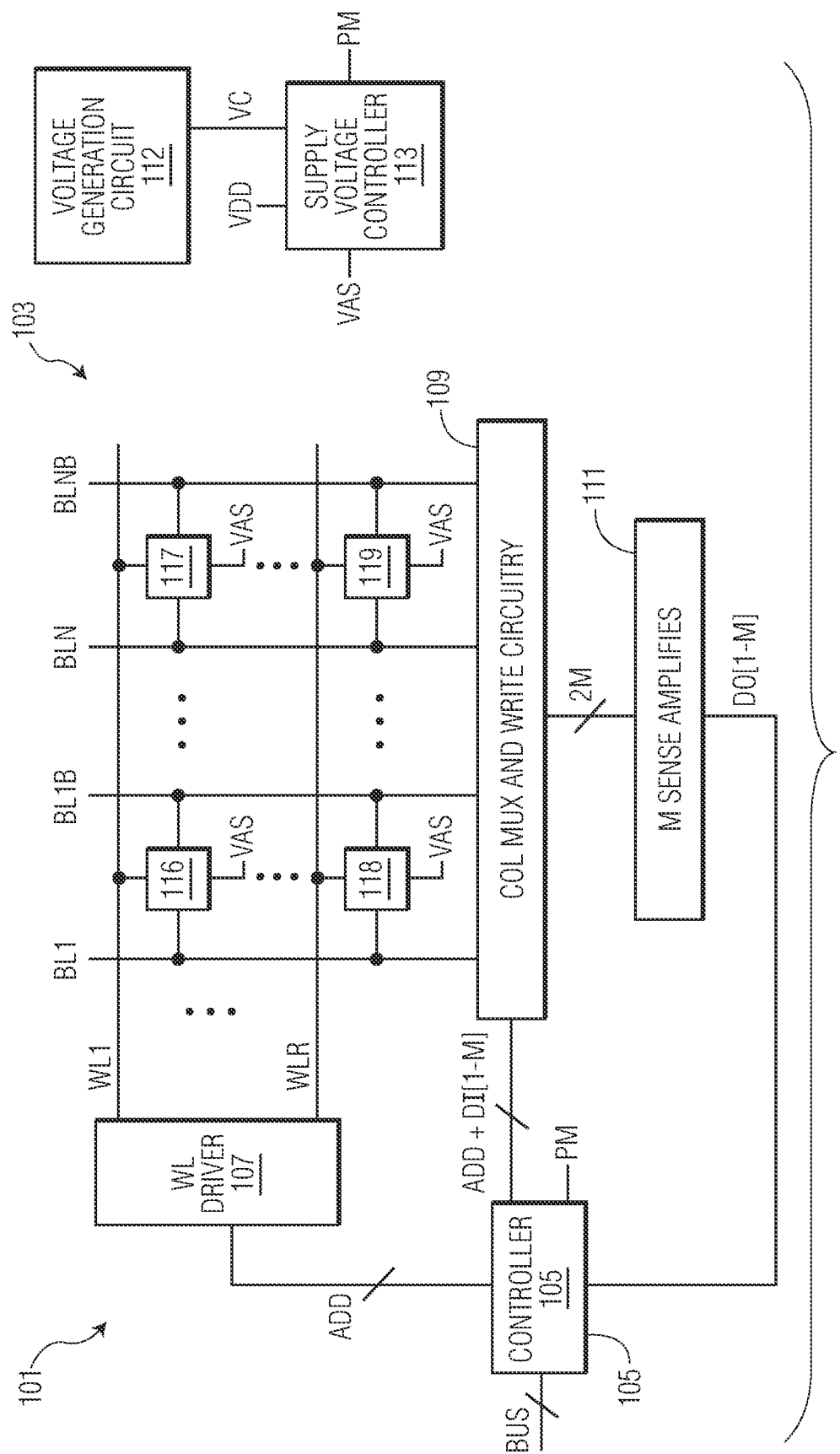
FIG. 1 is a circuit diagram of an SRAM according to one embodiment of the present invention.

FIG. 1 is a circuit diagram of an SRAM according to one embodiment of the present invention. SRAM 101 includes a memory array 103. In the embodiment shown, array 103 includes SRAM cells (e.g., 116-119) located in rows and columns. FIG. 1 shows only two rows and two columns of cells, but other arrays may include a significantly greater number of rows and columns. In the embodiment shown, the cells of each column are connected to a pair of complementary bit lines. For example, cells 116, and 118 are each connected to bit lines BL1 and BL1N and cells 117 and 119 are each connected to bit lines BLN and BLNB. Each cell of a row of array 103 is connected to a word line where cells 116 and 117 are connected to word line WL1 and cells 118 and 119 are connected to WLR. The word lines are each connected to control terminals of access transistors (e.g., 205 and 207 of FIG. 2) of the cells in their respective rows.

The cells of array 103 are selectively accessible by asserting a specific word line (W0 . . . WR) by word line driver 107 and by selecting the specific bit lines of the desired columns by column multiplexer and write circuitry 109. The column multiplexer of circuitry 109 is used to select the bit lines of a specific subset of columns of array 103 for memory access operations (e.g., read operations and write operations) based on a memory address of the operation. In one embodiment, array 103 includes N number of columns and circuitry 109 selects the bit lines of a subset of M columns for a read or write operation, where M is less than N.

SRAM 101 includes a number (M) of sense amplifiers 111, where each sense amplifier is coupled to a selected pair of complementary bit lines via circuitry 109 for reading data stored in an SRAM cell (e.g., 116-119) of array 103 that is connected to an asserted word line during a memory read operation. The output of the sense amplifiers (DO[1-M]) is provided as the read data to controller 105, which provides it on a memory bus (BUS) to the requesting circuitry (e.g., a processor, a memory management unit, not shown). During a read operation, controller 105 provides a portion of a received address from the memory bus (BUS) to word line driver 107 which decodes the address portion to assert the desired word line during the access operation. Controller 105 also provides a portion of the received address to circuitry 109 to select the bit lines of the desired columns to provide to sense amplifiers 111.

During a write operation, controller 105 provides a portion of the address to driver 107 to select the desired word line of the cells to be written and provides another portion of the address to circuitry 109 to select the column of the cells to be written. Circuitry 109 then biases the voltages of the selected bit lines as per the data to be written (DI[1-M]) received from the memory bus (BUS) via controller 105. The memory bus (BUS) also conveys control signals that are provided to controller 105 for controlling the operation of SRAM 101.

Memory 101 includes a supply voltage controller 113 that provides a supply voltage on supply terminal VAS that is connected to each cell of array 103 for providing power to the SRAM latch of the cell (see FIG. 2) during memory operation. In the embodiment shown, controller 113 receives supply voltage VDD (e.g., from a voltage regulator (not shown)) and supply voltage VC from voltage generation circuit 112. In the embodiment shown, supply voltage VDD is used to power the cells during memory access operations (e.g., memory reads, memory writes) and during high power static modes. A static mode is where the memory is operational and is holding data, but no access operations are being performed. In some embodiments, supply voltage VAS is used to power the cells during a low voltage static mode. In some embodiments, supply voltage VAS is used to power the cells during a low voltage access operation. In other embodiments, controller 113 may receive other supply voltages (not shown) that may be provided during memory operations. In some embodiments, the voltage level of the supply voltages (e.g., VDD, VC) may be adjusted during different modes of operation. In the embodiment shown, the specific supply voltage provided on terminal VAS is controlled by the PM signal from controller 105.

In other embodiments, SRAM 101 may have other configurations, other circuitry, and/or operate in other ways. For example, in some embodiments, the address lines of the address bus (BUS) may be connected directly to driver 107 and circuitry 109. In one embodiment, SRAM 101 is implemented as a system memory for a processing system. In other embodiments, SRAM 101 be utilized as a cache for a processing system. In some embodiments, SRAM 101 would be located on the same integrated circuit as the processor that is stores information for. In other embodiments, it may be located on a different integrated circuit. SRAM 101 can be used in a number of applications such as e.g., computing, wireless, industrial control, appliances, networking, and automotive.

Figure 2:
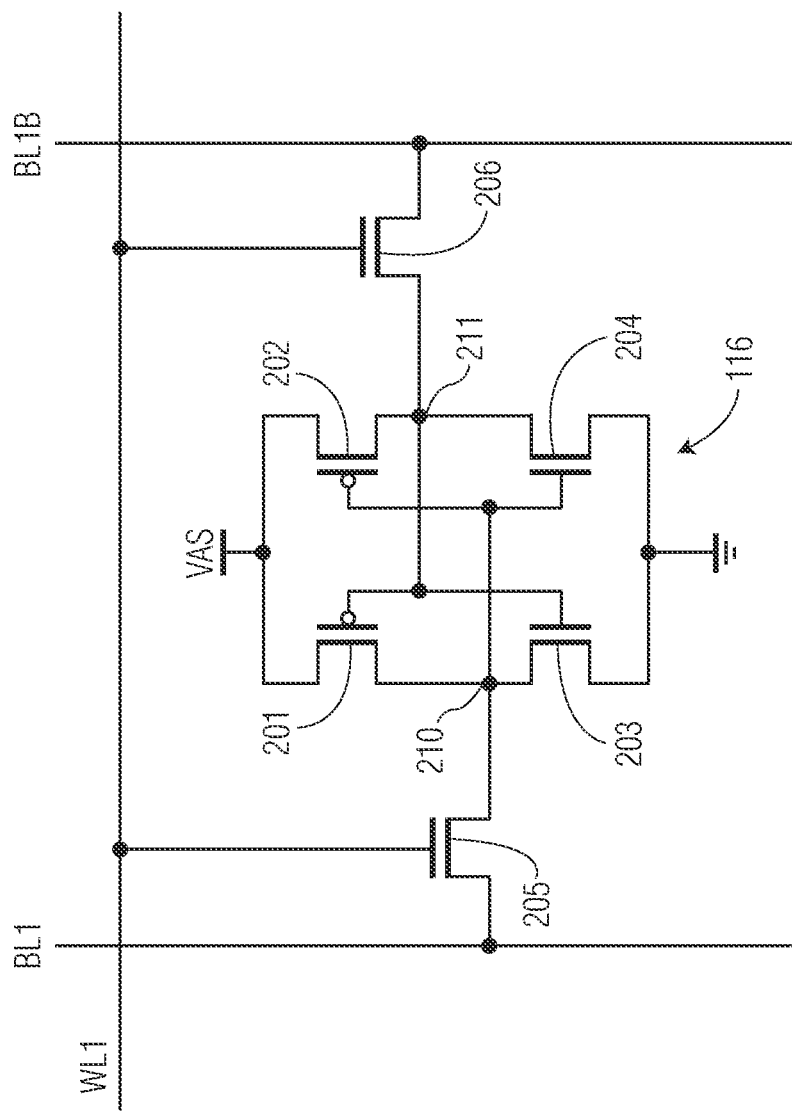
FIG. 2 is a circuit diagram of an SRAM cell of the SRAM of FIG. 1 according to one embodiment of the present invention.

FIG. 2 is a circuit diagram of an SRAM cell according to one embodiment of the present invention. In the embodiment shown, cell 116 is a 6 transistor cell with PFET 201 and NFET 203 forming a first inverter and PFET 202 and NFET 204 forming a second inverter that is cross coupled with the first inverter to form an SRAM latch. Cell 116 includes two complementary storage nodes 210 and 211 that latch at complementary voltage levels (e.g., ground, voltage VAS) to store a data value. In one embodiment, a "1" is stored when node 210 is at a high voltage (VAS) and node 211 is at a low voltage (ground) and a "0" is stored when node 210 is at the low voltage and node 211 is at the high voltage.

Cell 116 includes access transistors 205 and 206 that are made conductive by an asserted word line voltage on word line WL1 to couple node 210 to bit line BL1 and node 211 to bit line BL1B for reading a stored value or writing a value to cell 116.

The sources of NFETs 203 and 204 are connected to a ground terminal and the sources of PFET 201 and PFET 202 are connect to a VAS terminal to receive the supply voltage from controller 113. In some embodiments, the voltage differential between terminal VAS and ground determines the power consumption of cell 116 during operation. By lowering the voltage level of the VAS terminal, the amount of power consumed by cell 116 is reduced. In some embodiments, the sources of NFETs 203 and 204 are connected to terminals at other voltages other than ground (e.g., 0.1 volt, a negative voltage). However, the voltage differential must be at a sufficient level so as to retain the latched voltages at the storage nodes in order to retain data.

In other embodiments, an SRAM cell may have other configurations including having an SRAM latch of other configurations. For example, some SRAM cells may have a greater number of transistors. Some SRAM cells may be couplable to a different number of bit lines. For example, some SRAMs may have a read bit line per column in addition to the complementary bit lines for writing data.

Figure 3:
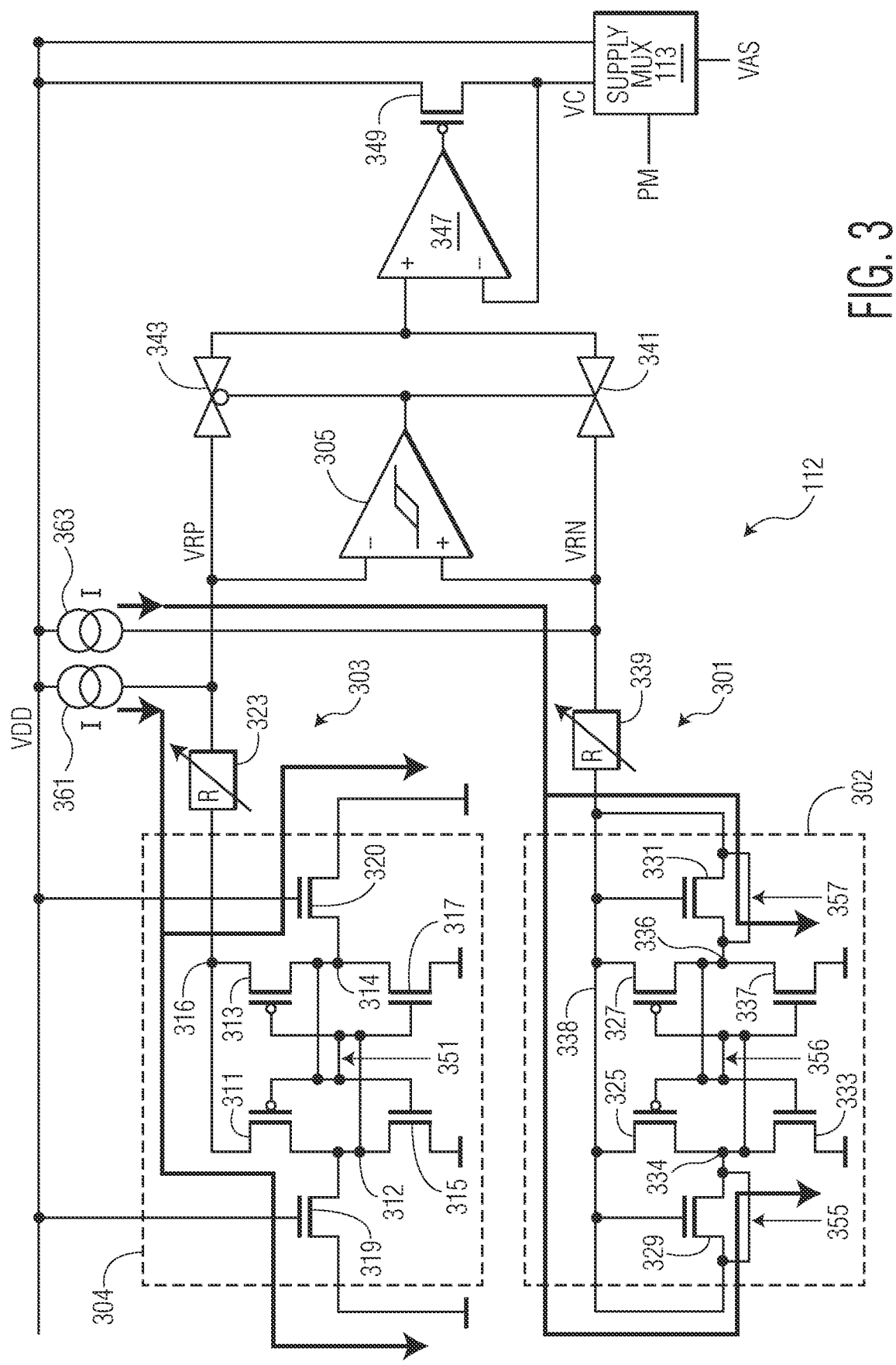
FIG. 3 is a circuit diagram of a voltage generation circuit for generating a supply voltage according to one embodiment of the present invention.

FIG. 3 is a circuit diagram of voltage generation circuit 112 and supply voltage controller 113 according to one embodiment of the present invention. Voltage generation circuit 112 generates supply voltage VC that is used to power the cells of array 103 in a low voltage mode such as a low voltage static mode in some embodiments.

Circuit 112 include two reference generation circuits 303 and 301. Reference generation circuit 303 includes SRAM cell 304. SRAM cell 304 includes PFETs 311 and 313 and NFETs 315 and 317 which form an SRAM latch of cross coupled inverters. In one embodiment, the SRAM latch of cell 304 is a replica of the SRAM latches of the cells of array 103 where PFETs 311 and 313 and NFETs 315 and 317 are generally the same size and have a similar physical layout as the PFETs (e.g., 201 and 202) and NFETs (e.g., 203 and 204) of the SRAM latches of the cells of array 103. Also, cell 304 includes two NFETs 319 and 320 which are generally the same size as the access transistors (205, 206) of the cells of array 103. Cell 304 is generally the same size and has a similar physical layout as the cells of array 103. In some embodiments, cell 304 is physically located in array 103.

In the embodiment shown, cell 304 is configured such that storage nodes 312 and 314 are shorted together by connection 351, which in one embodiment is implemented with conductive structures located in the interconnect layers of the integrated circuit of array 103. Also, access transistors 319 and 320 are biased at VDD such that they are always conductive to short storage nodes 312 and 314 to ground, which shorts the drains of NFETs 315 and 317 to their sources which are connected to ground. Circuit 303 includes a current source 361 that provides a current (I) that flows through programmable resistance circuit 323 and conductive PFETs 311 and 313 of cell 304 through transistors 319 and 320 to ground. The current does not flow through NFETs 315 and 317.

In the embodiment shown, the current from current source 361 flows through PFETs 311 and 313 which are each connected in a diode configuration in parallel where their gates and drains are connected together. Accordingly, the voltage at node 316 is the average threshold voltage of PFETs 311 and 313. Because SRAM cell 304 includes a replica SRAM latch with FETs of generally the same size and similar physical layout, the voltage at node 316 reflects the threshold voltage of the PFET transistors (e.g., 201 and 202) of the SRAM latches of the SRAM cells of array 103. Accordingly, the voltage of node 316 will vary with changes to the threshold voltage of the PFETs of the SRAM latches of array 103 due to process, temperature, and age.

Reference generation circuit 301 includes SRAM cell 302. SRAM cell 302 includes PFETs 325 and 327 and NFETs 333 and 337 which form an SRAM latch of cross coupled invertors. In one embodiment, the SRAM latch of cell 302 is a replica of the SRAM latches of the cells of array 103 where PFETs 325 and 327 and NFETs 333 and 337 are generally the same size as the PFETs (201 and 202) and NFETs (203 and 204) of the SRAM latches of the cells of array 103. Also, cell 302 includes two NFETs 319 and 320 which are generally the same size as the access transistors (205, 206) of the cells of array 103. Cell 302 is generally the same size and has a similar physical layout as the SRAM cells of array 103. In one embodiment, cell 302 is physically located in array 103.

In the embodiment shown, cell 302 is configured such that storage nodes 334 and 336 are shorted together by connection 356, which in one embodiment is implemented with conductive structures located in the interconnect layers of the integrated circuit of array 103. Also, access transistors 329 and 331 each have their sources and drains shorted together by connections 355 and 357 respectively. In one embodiment, connections 355 and 357 are implemented with conductive structures located in the interconnect layers of the integrated circuit of array 103. Circuit 301 includes a current source 363 that provides a current (I) that flows through programmable resistance circuit 339, connections 355 and 357 and conductive NFETs 333 and 337 of cell 302 to ground. The current does not flow through PFETs 325 and 327 in that their sources and drains are shorted together.

In the embodiment shown, the current from current source 363 flows through NFETs 333 and 337 which are each connected in a diode configuration in parallel where their gates and drains are connected together. Accordingly, the voltage at node 338 is the average threshold voltage of NFETs 333 and 337. Because SRAM cell 302 includes a replica SRAM latch with FETs that are generally the same size and have a similar physical layout, the voltage at node 338 reflects the threshold voltage of the NFET transistors (e.g., 203 and 204) of the SRAM latches of the SRAM cells of array 103. Accordingly, the voltage of node 338 will vary with changes to the threshold voltage of the NFETs of the SRAM latches of array 103 due to process, temperature, and age.

In the embodiment shown, reference circuits 301 and 303 each include only one SRAM cell 302 and 304, respectively. However, in other embodiments, each reference circuit may include more than one similarly configured SRAM cell connected in parallel. For example, reference circuit 303 may include multiple SRAM cells similarly configured as cell 304 that are each connected to node 316. Likewise, reference circuit 301 may include multiple SRAM cells similarly configured as cell 302 that are each connected to node 338. In some embodiments, these multiple SRAM cells of the reference circuits may be distributed throughout array 103 to provide more accurate voltages representative of the threshold voltages of the NFETs and PFETs of array 103. In other embodiments, the multiple SRAM cells of reference circuit 301 and of reference circuit 303 may be located in a replica array (not shown). In some embodiments, the replica cells of circuits 301 and 303 would not include connections 351 and 356 for shorting the latch storage nodes (312, 314, 334, 336) together.

Voltage generation circuits 301 and 303 each include a resistance circuit 339 and 323, respectively, for providing a guard band voltage to the determined threshold voltages of each of circuit 301 and 303 at nodes 338 and 316 to produce reference voltages VRN and VRP, respectively. The guard band voltages provide a safety margin to voltage VC such that voltage VC will be higher than the threshold voltage of any NFET or PFET in array 103 to account for variations within array 103 of the threshold voltages of the NFETs and PFETs. In one embodiment, the size of the guard band voltage is in a range of 5-20 percent of the expected threshold voltages, but may be of other amounts in other embodiments. The provided guard band voltage is based on the amount of resistance provided by the resistant circuits and the amount of current form each current source 361 and 363. In some embodiments, current from sources 361 and 363 are set at a high enough value that the diode configured transistors of cells 304 and 302 operate in a linear mode but not so high as to unnecessarily consume power. In one embodiment, the amount of current provided by current sources 361 and 363 is dependent upon the number of SRAM cells (302, 304) per reference circuit (301, 303). In some embodiments, the current sources 361 and 363 are disabled when voltage generation circuit 112 is not providing power to the cells of array 103 such as e.g., when array 103 in not in a low power mode.

In the embodiment shown, resistance circuits 323 and 339 are programmable to provide different resistance values. In some embodiments, providing a voltage reference circuits with programmable resistance circuits allows for testing to be performed on the circuit to determine a lowest acceptable guard band voltage. This testing may be done at manufacture, startup, or during operation. Also, providing a programmable resistance circuit may give customers or end users an option of adjusting the guard band voltage to provide a balance between power consumption and higher levels of data storage integrity. In other embodiments, resistance circuits 323 and 339 are not programmable. In still other embodiments, the voltage reference circuits do not include guard band resistance circuits.

Circuit 112 includes a comparator 305 that compares VRP (which is indicative of the threshold voltage of the PFETs of array 103) and VRN (which is indicative of the threshold voltage of the NFETs of array 103) to determine which is the higher voltage. The output of comparator 305, which is indicative of the higher voltage, controls passgates 343 and 341 to provide the higher of VRP or VRN to the non inverting input of op amp 347. Passgate 343 is conductive when VRP is the higher voltage and passgate 341 is conductive when VRN is the higher voltage. In the embodiment shown, comparator has a hysteresis function that prevents gates 343 and 341 from constantly switching when VRP is close to VRN. In other embodiments, circuit 112 may include other types of voltage comparison circuitry that provides the higher of two voltages.

The inverting input of op amp 347 is connected to the drain of power PFET 349. The output of op amp 347 controls the conductivity of power PFET 349 such that the drain of PFET 349 provides a voltage VC that matches the higher of voltage VRP or VRN provided to the non inverting input of op amp 347. Voltage VC is provided to an input of controller 113 and voltage VDD is supplied to another input of controller 113. Controller 113 selects which of voltage VC or voltage VDD to supply to terminal VAS based on the power mode indicated by the PM signal from SRAM controller 105.

Circuit 112 and controller 113 may include other devices, have other configurations, and/or operate by other methods. For example, in some embodiments, an output of a voltage selector (not shown) may be connected to the non inverting input of op amp 347. One input of the voltage selector would receive the higher of voltage VRP or voltage VRN and the other would receive voltage VDD. Depending on the mode of operation, then higher of voltage VRN or VRP or voltage VDD would be provided to the non inverting input of op amp 347 as determined by the voltage selector such that the drain of PFET 349 would produce the desired array supply voltage at terminal VAS. These alternative embodiments would not include controller 113. In other embodiments, the array supply voltage may be at other voltage levels for some modes of operation.

As described above in some embodiments, the supply voltage generation circuit includes two reference circuits that each include at least one SRAM cell. One of the reference circuits is configured to provide a voltage (VRP) indicative of the threshold voltage of the PFETS of the SRAM latches of an array of SRAM cells and the other is configured to provide a voltage (VRN) indicative of the threshold voltage of the NFETs of the SRAM latches of the array. The comparison circuit compares the two voltages and provides the higher of the two voltages to provide a supply voltage that is sufficient for an SRAM latch to hold its data state while minimizing the amount of power being used by the SRAM latch. With some manufacturing conditions, variations in the manufacturing parameters (e.g., in conductivity doping concentrations) may cause variations in the threshold voltages of the PFETs and NFETS. Accordingly, circuit 112 can adjust the supply voltage to account for such variations in the threshold voltages. Furthermore, the supply voltage generation circuit can also adjust the supply voltage to in response to changes in the threshold voltages due to changes in operating conditions such from temperature fluctuation and age.

A gate is a control terminal of a FET. A sources and a drain are current terminals of FET.

In one embodiment, a memory includes a plurality of SRAM memory cells. Each SRAM memory cell of the plurality of SRAM memory cells includes an SRAM latch for storing a value. The memory includes a voltage generation circuit including a first reference generation circuit including a first group of at least one SRAM cell. Each SRAM cell of the first group includes an SRAM latch that is a replica SRAM latch to SRAM latches of the plurality of SRAM memory cells. The first reference generation circuit provides a first voltage during an at least one mode of memory operation. The voltage generation circuit includes a second reference generation circuit including a second group of at least one SRAM cell. Each SRAM cell of the second group includes an SRAM latch that is a replica SRAM latch to SRAM latches of the plurality of SRAM memory cells. The second reference generation circuit provides a second voltage during the at least one mode of memory operation. The voltage generation circuit includes a comparison circuit including a first input to receive the first voltage, a second input to receive the second voltage, and an output to provide an indication of the first voltage or the second voltage based on a comparison between the first voltage and the second voltage. The voltage generation circuit includes an output providing a supply voltage to the plurality of SRAM memory cells during the at least one mode of memory operation. A voltage level of the supply voltage is based on the output of the comparison circuit.

In another embodiment, a memory includes a plurality of SRAM memory cells. Each SRAM memory cell of the plurality of SRAM memory cells including an SRAM latch for storing a value. The memory includes a voltage generation circuit including a first reference generation circuit including a first group of at least one SRAM cell. Each SRAM cell of the first group includes an SRAM latch that is a replica SRAM latch to SRAM latches of the plurality of SRAM memory cells. The first reference generation circuit providing a first voltage during an at least one mode of memory operation. The voltage generation circuit includes a second reference generation circuit including a second group of at least one SRAM cell. Each SRAM cell of the second group includes an SRAM latch that is a replica SRAM latch to SRAM latches of the plurality of SRAM memory cells. The second reference generation circuit providing a second voltage during the at least one mode of memory operation. The voltage generation circuit includes an output providing a supply voltage to the plurality of SRAM memory cells during the at least one mode of memory operation. The supply voltage being one of the first voltage or the second voltage based on which one of the first voltage or the second voltage is a higher voltage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
   a plurality of SRAM memory cells, each SRAM memory cell of the plurality of SRAM memory cells including an SRAM latch for storing a value;
   a voltage generation circuit comprising:
      a first reference generation circuit including a first group of at least one SRAM cell, each SRAM cell of the first group includes an SRAM latch that is a replica SRAM latch to SRAM latches of the plurality of SRAM memory cells, the first reference generation circuit providing a first voltage during an at least one mode of memory operation;
      a second reference generation circuit including a second group of at least one SRAM cell, each SRAM cell of the second group includes an SRAM latch that is a replica SRAM latch to SRAM latches of the plurality of SRAM memory cells, the second reference generation circuit providing a second voltage during the at least one mode of memory operation;
      a comparison circuit including a first input to receive the first voltage, a second input to receive the second voltage, and an output to provide an indication of the first voltage or the second voltage based on a comparison between the first voltage and the second voltage;
      an output providing a supply voltage to the plurality of SRAM memory cells during the at least one mode of memory operation, a voltage level of the supply voltage being based on the output of the comparison circuit.

2. The memory of claim 1 wherein:
   each SRAM latch of the first group includes two NFETs and two PFETs, the first voltage is indicative of a threshold voltage of the two PFETs of the each SRAM latch of the first group;
   each SRAM latch of the second group includes two NFETs and two PFETs, the second voltage is indicative of a threshold voltage of the two NFETs of the each SRAM latch of the second group.

3. The memory of claim 1 wherein:
   each SRAM latch of the first group includes two NFETs and two PFETs, each SRAM latch of the first group is configured to provide current through the two PFETs and not through the two NFETs;

each SRAM latch of the second group includes two NFETs and two PFETs, each SRAM latch of the second group is configured to provide current through the two NFETs and not through the two PFETs.

4. The memory of claim 1 wherein:
each SRAM latch of the first group includes two NFETs and two PFETs, each SRAM latch of the first group is configured such that the two PFETs are in a diode configuration during the at least one mode and for each of the two NFETs, a source and a drain of the NFET are electrically shorted together during the at least one mode;
each SRAM latch of the second group includes two NFETs and two PFETs, each SRAM latch of the second group is configured such that the two NFETs are in a diode configuration during the at least one mode and for each of the two PFETs, a source and a drain of the PFET are electrically shorted together during the at least one mode.

5. The memory of claim 1 wherein:
each SRAM latch of the first group includes a first storage node and a second storage node, where the first storage node of the each SRAM latch is shorted to the second storage node of the each SRAM latch;
each SRAM latch of the second group includes a first storage node and a second storage node, where the first storage node of the each SRAM latch is shorted to the second storage node of the each SRAM latch.

6. The memory of claim 1 wherein:
the first reference generation circuit includes a first resistance circuit coupled to the first input to provide a guard band voltage to the first voltage during the at least one mode of memory operation;
the second reference generation circuit includes a second resistance circuit coupled to the first input to provide a guard band voltage to the second voltage during the at least one mode of memory operation.

7. The memory of claim 6 wherein the first resistance circuit and the second resistance circuit are each programmable.

8. The memory of claim 1 wherein the voltage level of the supply voltage is based on whether the first voltage or the second voltage is a higher voltage based on the output of the comparison circuit.

9. The memory of claim 1 wherein the supply voltage is one of the first voltage or the second voltage based on the output of the comparison circuit.

10. The method of claim 1 wherein the at least one mode of memory operation includes a static memory mode of operation.

11. The memory of claim 1 further comprising:
a supply voltage selector circuit including a first input coupled to the output and a second input coupled to a second voltage source, wherein the supply voltage selector circuit includes an output coupled to the plurality of SRAM memory cells that supplies the supply voltage to the plurality of SRAM memory cells during the at least one mode of memory operation and supplies a second supply voltage from the second voltage source during at least another mode of operation different than the at least one mode of memory operation.

12. The memory of claim 11 wherein the at least another mode of operation includes a memory access mode of operation.

13. The memory of claim 11 wherein the second supply voltage is a higher voltage than the supply voltage.

14. The memory claim 1 further comprising:
a first current source configured to provide current to the SRAM latches of the first reference generation circuit during the at least one mode of memory operation
a second current source configured to provide current to the SRAM latches of the second reference generation circuit during the at least one mode of memory operation.

15. The memory of claim 14 wherein the first current source is coupled to a first node in a current path to the first input of the comparison circuit and the second current source is coupled to a second node in a second current path to the second input of the comparison circuit.

16. The memory of claim 1 wherein:
each SRAM cell of the first group includes a first access transistor and a second access transistor, the first access transistor includes a first current terminal connected to a first storage node of the each SRAM cell of the first group and a second current terminal connected to ground, the second access transistor includes a first current terminal connected to a second storage node of the each SRAM cell of the first group and a second current terminal connected to ground;
each SRAM cell of the second group includes a first access transistor and a second access transistor, the first access transistor includes a first current terminal and a second current terminal that are shorted together and the second access transistor includes a first current terminal and a second current terminal that are shorted together.

17. A memory comprising:
a plurality of SRAM memory cells, each SRAM memory cell of the plurality of SRAM memory cells including an SRAM latch for storing a value;
a voltage generation circuit comprising:
a first reference generation circuit including a first group of at least one SRAM cell, each SRAM cell of the first group includes an SRAM latch that is a replica SRAM latch to SRAM latches of the plurality of SRAM memory cells, the first reference generation circuit providing a first voltage during an at least one mode of memory operation;
a second reference generation circuit including a second group of at least one SRAM cell, each SRAM cell of the second group includes an SRAM latch that is a replica SRAM latch to SRAM latches of the plurality of SRAM memory cells, the second reference generation circuit providing a second voltage during the at least one mode of memory operation;
an output providing a supply voltage to the plurality of SRAM memory cells during the at least one mode of memory operation, the supply voltage being one of the first voltage or the second voltage based on which one of the first voltage or the second voltage is a higher voltage.

18. The memory of claim 17 wherein:
each SRAM latch of the first group includes two NFETs and two PFETs, the first voltage is indicative of a threshold voltage of the two PFETs of the each SRAM latch of the first group;
each SRAM latch of the second group includes two NFETs and two PFETs, the second voltage is indicative of a threshold voltage of the two NFETs of the each SRAM latch of the second group.

19. The memory of claim 17 wherein:
each SRAM latch of the first group includes two NFETs and two PFETs, each SRAM latch of the first group is configured to provide current through the two PFETs and not through the two NFETs;
each SRAM latch of the second group includes two NFETs and two PFETs, each SRAM latch of the second group is configured to provide current through the two NFETs and not through the two PFETs.

20. The memory of claim 17 wherein:
each SRAM latch of the first group includes two NFETs and two PFETs, each SRAM latch of the first group is configured such that the two PFETs are in a diode configuration during the at least one mode and for each of the two NFETs, a source and a drain of the NFET are electrically shorted together during the at least one mode;
each SRAM latch of the second group includes two NFETs and two PFETs, each SRAM latch of the second group is configured such that the two NFETs are in a diode configuration during the at least one mode and for each of the two PFETs, a source and a drain of the each are electrically shorted together during the at least one mode.

* * * * *